United States Patent
Happ et al.

(10) Patent No.: US 12,181,505 B2
(45) Date of Patent: Dec. 31, 2024

(54) SYSTEM FOR MEASURING THE TRANSFER FUNCTION ON A PATH FROM A FEED ANTENNA VIA A REFLECTOR TO A RADAR SENSOR TESTING ZONE

(71) Applicant: dSPACE GmbH, Paderborn (DE)

(72) Inventors: Fabian Happ, Paderborn (DE); Andreas Himmler, Paderborn (DE); Jeffrey Paul, Torrance, CA (US)

(73) Assignee: DSPACE GMBH, Paderborn (DE)

( * ) Notice: Subject to any disclaimer, the term of this patent is extended or adjusted under 35 U.S.C. 154(b) by 135 days.

(21) Appl. No.: 18/130,442

(22) Filed: Apr. 4, 2023

(65) Prior Publication Data

US 2024/0337679 A1     Oct. 10, 2024

(51) Int. Cl.
*G01R 29/08* (2006.01)
*G01S 7/40* (2006.01)

(52) U.S. Cl.
CPC ........ *G01R 29/0871* (2013.01); *G01S 7/4086* (2021.05)

(58) Field of Classification Search
CPC .......................... G01R 29/0871; G01S 7/4086
USPC ................................ 324/642, 637, 629, 600
See application file for complete search history.

(56) References Cited

U.S. PATENT DOCUMENTS

| | | | |
|---|---|---|---|
| 11,709,191 B1 * | 7/2023 | Rowell | H01Q 15/14 324/754.31 |
| 2022/0404464 A1 | 12/2022 | Paul | |
| 2023/0408648 A1 * | 12/2023 | Berneck | G01R 29/0871 |
| 2024/0192258 A1 * | 6/2024 | Reiter | G01R 29/0878 |

FOREIGN PATENT DOCUMENTS

DE      102022115284 A1     12/2022

OTHER PUBLICATIONS

Garat J et al: "Microwave techniques for radar cross section measurements. A review", Proceedings of 8th Mediterranean Electrotechnical Conference on Industrial Applications in Power Systems, Computer Science and Telecommunications (MELECON 96), May 13, 1996 (May 13, 1996), pp. 80-86, IEEE, New York, US, XP000696217, DOI: 10.1109/MELCON.1996.550967, ISBN: 978-0-7803-3110-5.

* cited by examiner

*Primary Examiner* — Giovanni Astacio-Oquendo
(74) *Attorney, Agent, or Firm* — LEYDIG, VOIT & MAYER, LTD.

(57) ABSTRACT

A system for measuring the transfer function on a path from a feed antenna via a reflector to a radar sensor testing zone includes: an anechoic chamber; the feed antenna, wherein the feed antenna is configured to transmit and receive a radar signal, and wherein the feed antenna is disposed, together with the reflector, within the anechoic chamber; the radar sensor testing zone, wherein the radar sensor testing zone is a predetermined area within the anechoic chamber; and a retroreflector disposed in the radar sensor testing zone, wherein the retroreflector is configured to cause at least a portion of a measurement signal in the radar frequency range to be reflected back to the feed antenna via the reflector, wherein the measurement signal is received from the feed antenna via the reflector.

15 Claims, 5 Drawing Sheets

SYSTEM FOR MEASURING THE TRANSFER FUNCTION ON A PATH FROM A FEED ANTENNA VIA A REFLECTOR TO A RADAR SENSOR TESTING ZONE

FIELD

The invention relates to a system for measuring the transfer function on a path from a feed antenna via a reflector to a radar sensor testing zone, the system having an anechoic chamber, and the feed antenna being configured to transmit and receive a radar signal and being disposed, together with the reflector, within the anechoic chamber, and the radar sensor testing zone being a predetermined area within the anechoic chamber, in which area a radar sensor under test is to be tested with the aid of a radar target simulator via a radar signal transmitted by the feed antenna.

BACKGROUND

In the prior art, it is well known to simulate radar targets and radar echoes for automotive radar sensors on a physical level according to the over-the-air principle using radar target simulators. Radar sensors play an important role when it comes to integrating solutions for assisted and autonomous driving in motor vehicles. Suitable radar target simulators are used to ensure the correct functioning of sensors and developed application software in different phases of the development, production and release process for sensors and vehicles as well as for use in the retrofit market. Using such radar target simulators, radar sensors can be tested in the laboratory in clearly definable, reproducible scenarios. In the process, object reflections, so-called radar targets, which occur in road traffic at different distances and with different speeds and sizes are simulated in real time. Tests of the type under discussion play a decisive role in the validation of radar-based driver assistance systems and autonomous vehicles. The corresponding radar target simulators are available for development and testing in the laboratory, for end-of-line tests during production, for the homologation of a vehicle, and for the aftermarket.

The radar target simulators in question work according to the over-the-air principle: A real sensor is simulated in real time during operation. The radar target simulator receives the signal from the radar sensor, generate an internal echo, and return it to the radar sensor. Therefore, the radar sensor can be operated and tested exactly as in a real environment.

To test the sensor in a defined way, extensive manipulations of the echoes are possible: The distance of an object or target is simulated by delaying the echo; its velocity is simulated by changing the frequency, and the object size is simulated by attenuating the reflected energy. To determine the azimuth angle, the receive and transmit modules can be placed and moved differently. Alternatively, a system with several receive and transmit modules can be set up. With a mechatronic extension solution, even continuous angle simulation is possible.

Using such radar target simulators, developers of ADAS/AD applications (advanced driver assistance systems/autonomous driving) can perform required tests quickly, effectively, and thoroughly. This is made possible by the very precise and reliable echo generation combined with the flexible possibilities to support relevant applications. Object detection scenarios such as adaptive cruise control (ACC), autonomous emergency braking (AEB), pedestrian detection, or cut-in/cut-out maneuvers can be realistically modeled with these radar target simulators.

An end-of-line (EOL) test bench for mass-produced automotive radar sensors is typically used to test the functionality of finished assemblies and to calibrate them in an automated fashion in a compact and low-reflection anechoic chamber using radar target simulation. The measurement of operating parameters of the radar sensors to be tested (radar under test, RUT) and their calibration are carried out in a defined test sequence in which the radar sensor is rotated around its radiation center in the horizontal and vertical directions via high-precision drives.

In a compact antenna test range (CATR) of an EOL test bench for testing radar control units, a feed antenna and a reflector must be precisely aligned with each other. The aim is to generate a substantially plane electromagnetic field in the area where the RUT is placed. This area is called a "quiet zone" and will hereinafter also be referred to as a "radar sensor testing zone." Since the mechanical prealignment of the components can be accomplished only with finite precision, the result has to be carried out by a measurement of the transfer function from the feed antenna into the quiet zone using a network analyzer. The transfer function is complex-valued. Via the variation of the amplitude and phase of the transfer function over different locations in the quiet zone, it is possible to evaluate the alignment of the components and to determine a required correction.

The corrections may be made, for example, by mechanically aligning the feed antenna and the CATR reflector relative to each other. The aim of this is to position the feed antenna exactly at the focal point of the reflector. A second option for correction is to vary the position of the RUT. If one knows the number of degrees by which the phase front is inclined, the RUT can be tilted by this angle so that it receives a plane wave. It is also possible to make a correction within the evaluation of the data obtained by the RUT. The RUT typically has several transmit and receive antennas. The viewing direction of the RUT can be determined by suitably controlling the antennas. A known misalignment can then be computationally corrected during the evaluation of the data captured by the RUT, for example by applying different delays to the data of the different receive antennas.

In connection therewith, the following technical problems arise: In the prior art, in order to measure directly in the quiet zone, a receiver unit is placed in the quiet zone. This receiver unit must be connected by cables to a measurement device external to the anechoic chamber. The means that long cables must be routed into the closed anechoic chamber. This makes it somewhat laborious to change the setup. Moreover, the presence of the cables in the anechoic chamber may influence the measurements. In addition, since the receiver unit is moved to different positions in the quiet zone for the purpose of measurement, the cables are moved as well. This movement influences the phase of the measured signal. It is not possible to later separate these phase changes from the phase of the transfer function to be measured.

In present practice, the measuring cables are routed into the anechoic chamber through an additional opening. In connection therewith, to keep the influence on the measurement low, the cables are often connected to the receiver unit in a loop on the side facing away from the reflector. This approach accepts the influence of the cable movements on the phase.

DE 10 2022 115 284 A1 describes that, in a test mode, a test signal unit generates a test signal, and the test signal or a test signal derived from the test signal is radiated as an output signal via the radiating element, an analysis unit analyzing the receive signal or the derived receive signal in terms of its phase angle and/or amplitude and storing the determined value of phase angle and/or amplitude in the test mode synchronously with the radiation of the test signal or of the derived test signal as an output signal. The provision of the test signal unit makes it possible to generate a test signal and radiate it via the radiating element into the external space as needed. In other testing devices, this was previously not possible because they only radiate previously received signals with a suitable time delay.

With the measures described in DE 10 2022 115 284 A1, it became possible to leave the testing device in its installed position for the testing of a distance sensor test bench; i.e., the testing device does not need to be replaced with a special transmitter. Thus, the principle here is that the transmitted test signal or the test signal derived from the test signal is reflected in the distance sensor test bench assembly and received by the testing device. Thus, the receive signal then received by the testing device corresponds to the transmitted and reflected test signal in the test mode. This receive signal or the receive signal derived therefrom can then be analyzed in terms of its phase angle and/or amplitude by the analysis unit. The analysis is usually performed with respect to a reference signal, which may be, for example, the transmitted test signal.

SUMMARY

In an exemplary embodiment, the present invention provides a system for measuring the transfer function on a path from a feed antenna via a reflector to a radar sensor testing zone. The system includes: an anechoic chamber; the feed antenna, wherein the feed antenna is configured to transmit and receive a radar signal, and wherein the feed antenna is disposed, together with the reflector, within the anechoic chamber; the radar sensor testing zone, wherein the radar sensor testing zone is a predetermined area within the anechoic chamber, in which area a radar sensor under test is to be tested with the aid of a radar target simulator via a radar signal transmitted by the feed antenna; and a retroreflector disposed in the radar sensor testing zone, wherein the retroreflector is configured to cause at least a portion of a measurement signal in the radar frequency range to be reflected back to the feed antenna via the reflector, wherein the measurement signal is received from the feed antenna via the reflector.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
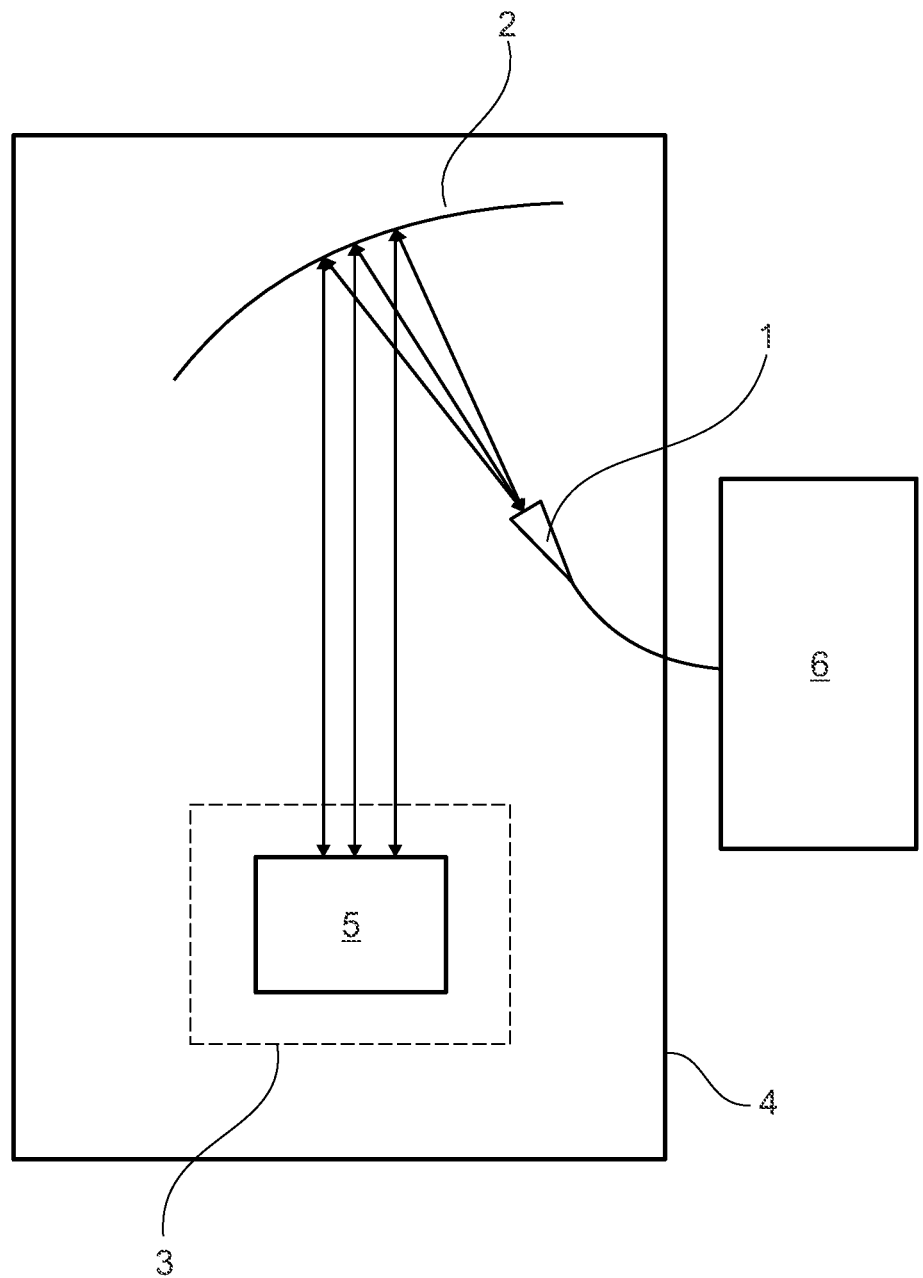
FIG. 1 is a schematic view of a system for testing a radar sensor via a radar target simulator.

Exemplary embodiments of the invention provide a high-precision measurement of the transfer function on a path from a feed antenna via a reflector to a radar sensor testing zone in an anechoic chamber.

Thus, in accordance with the invention, there is provided a system for measuring the transfer function on a path from a feed antenna via a reflector to a radar sensor testing zone, the system having an anechoic chamber, and the feed antenna being configured to transmit and receive a radar signal and being disposed, together with the reflector, within the anechoic chamber, and the radar sensor testing zone being a predetermined area within the anechoic chamber, in which area a radar sensor under test is to be tested with the aid of a radar target simulator via a radar signal transmitted by the feed antenna, and a retroreflector being disposed in the radar sensor testing zone to cause at least a portion of a measurement signal in the radar frequency range, which measurement signal is received from the feed antenna via the reflector, to be reflected back to the feed antenna via the reflector.

The term "anechoic chamber" as used herein refers to an environment having absorbers for electromagnetic waves attached internally to its metallic, electrically conductive walls. The anechoic chamber differs from the low-reflection rooms commonly used in acoustics in that the absorbers on its walls are able to absorb electromagnetic waves and not sound waves.

A retroreflector is a device that reflects most of the incident electromagnetic radiation back in the direction from which it came, and does so substantially independently of the direction of incidence with respect to the alignment of the device. The retroreflector is, for example, a corner reflector.

The measurement signal is a signal whose frequency is in the radar frequency range. However, it does not itself have to be a useful radar signal, such as a chirp signal. The portion of the measurement signal that is reflected back and therefore received by the feed antenna will in the following also be referred to as the measurement signal received by the feed antenna.

According to the invention, instead of the receiver unit, a retroreflector is placed in the quiet zone. Then, no measuring cables need to be routed into the interior of the anechoic chamber. At the retroreflector, the incident electromagnetic wave is reflected back in the direction from which it came. The reflected wave travels via the reflector back to the feed antenna, where it can be measured. Using this method, the transfer function of the double path is measured. In order to obtain the transfer function of the single path, the measured values are subsequently converted.

Since the phase of a propagating electromagnetic wave is linearly related to the distance traveled, traveling twice the distance causes the phase to be doubled as compared to the single path. Thus, in order to obtain the transfer function of the single path, the value of the measured phase must be divided by a factor of 2. The amplitude is inversely proportional to the square of the distance traveled. The single path corresponds to the transfer formula according to Harald Friis. The transfer function measured using the described approach corresponds to the radar equation. The conversion is done using a factor that can be calculated from the radar cross section of the retroreflector used and the air path.

The invention provides, inter alia, the advantage that no additional measuring cables need to be routed into the anechoic chamber, which could influence the measurement results by their presence or motion. This improves the signal quality of the measurement results and also eliminates the cost of purchasing the measuring cables. In addition, there is no need to modify the anechoic chamber to provide a passage for measuring cables.

In an advantageous embodiment, the system according to the invention has a network analyzer which is connected to the feed antenna and adapted to cause the measurement signal to be applied to the feed antenna so that it is transmitted by the feed antenna and, in addition, to receive a portion of the measurement signal that is reflected back to and received by the feed antenna so that this measurement signal, or a measurement signal derived therefrom, can be analyzed. In this context, the measurement signal does not have to be a radar signal of a type such as is typically used in the operation of the radar sensor to be tested later. Rather, the measurement signal may also be a simple monofrequency signal in the form of a sine wave. The network analyzer, preferably successively, transmits such a sinusoidal signal of a particular frequency and, upon evaluation of the measurement with this frequency, selects and transmits a next frequency, so that, overall, a frequency range can be covered that is of interest for the particular testing of a radar sensor.

Furthermore, a preferred embodiment of the invention provides that the system itself has an evaluation unit configured to determine the transfer function from the feed antenna to the retroreflector. The evaluation unit may be part of the network analyzer or may be provided separately therefrom.

In accordance with a preferred embodiment of the invention, the system further has a time-gating device configured to allow signals received by the network analyzer to be distinguished in terms of their propagation time. The background to this preferred embodiment of the invention is that it cannot be ruled out that a reflection may occur when the signal is coupled into the feed antenna. This reflection would be superimposed on the measured signal. The reflected signal and the measurement signal would then be in the same frequency range and, therefore, could not be separated by a filter. In view of this, the signals are separated by windowing in the time domain (time gating). This allows the signals to be distinguished by their different propagation times. To this end, preferably, the measured frequency range data is transformed by an inverse Fourier transform into the time domain. There, a particular time interval is selected by a window function. Then, the windowed signal is transformed back into the frequency domain. The signal so processed then contains the information about the transfer function sought.

The system according to the invention can, in principle, be operated without an amplifier. However, in accordance with a preferred embodiment of the invention, the network analyzer is provided with an input for receiving the measurement signal reflected back to and received by the feed antenna, and that an amplifier is connected in series to this input. This makes it possible to detect even small signals.

Furthermore, a preferred embodiment of the invention provides that the system has a transmit frequency converter for applying to the feed antenna the measurement signal to be transmitted and a receive frequency converter for receiving the reflected portion of the measurement signal. These frequency converters are preferably high-bandwidth converters. The high-bandwidth converters feature a compact design. In this context, it is possible to use, for example, the high-bandwidth converters that belong to the device named DARTS 9040-G of the dSPACE company. Moreover, it is preferred that the transmit frequency converter be configured to convert the measurement signal to a higher frequency, and that the receive frequency converter be configured to convert the measurement signal to a lower frequency. In connection therewith, it is preferred that the higher frequency be greater than 6 GHZ, and preferably at least 24 GHz, and that the lower frequency be less than 6 GHz. Radar signals used in automotive applications are typically in the range between 24 GHz and 81 GHz.

Exemplary embodiments of the invention measure the aforementioned transfer function in order to know it and be able to take it into account during subsequent testing of a radar sensor via a radar target simulator. In connection therewith, a preferred embodiment of the invention provides for using, as the transmit frequency converter and as the receive frequency converter, a transmit frequency converter and a receive frequency converter of the radar target simulator that is to be used for the testing of the radar sensor to be subsequently tested. Thus, the frequency converters used are those which are present in the radar target simulator anyway. In connection therewith, preferably, the frequency converters of the radar target simulator are supplied with a DC voltage and a local oscillator signal for a respective frequency converter in the respective frequency converter.

Thus, to test the alignment of the system in question, there is no need to remove any frequency converter of the radar target simulator and use it as a measuring receiver in the quiet zone; i.e., in the radar sensor testing zone. This reduces the effort required to change the test setup since only the retroreflector needs to be installed. Making major changes to the setup would otherwise always involve the risk of components being inadvertently damaged or wrongly connected. Another advantage is that when the frequency converters of the radar target simulator are used in the test setup, there is no need to measure the signal in the frequency range up to 81 GHz, which would only be possible with very expensive measuring devices. With a method according to the invention, it is possible to use a network analyzer for frequencies less than 6 GHz. Thus, a mobile measuring device can be used instead of a large laboratory apparatus.

In accordance with a preferred embodiment of the invention, a coupler is connected between the feed antenna, on one side, and the transmit frequency converter and the receive frequency converter on the other side, the coupler being configured to separate the received measurement signal from the transmitted measurement signal. Furthermore, it is preferred that a bandpass filter be connected between the transmit frequency converter and the coupler, the bandpass filter being configured such that the feed antenna can only transmit measurement signals within a predetermined frequency range. This is advantageous in that it makes it possible to reduce or completely prevent superimposition of signals which are outside the frequency band on the payload signals on the receive side during conversion.

The transmit frequency converter and the bandpass filter can, in principle, be connected directly to each other. However, in accordance with a preferred embodiment of the invention, an isolator is connected between the transmit frequency converter and the bandpass filter to attenuate reflected signals coming from the direction of the bandpass filter and the coupler and not to feed them back to the transmit frequency converter. This makes it possible to reduce or avoid unwanted resonance phenomena caused by reflected signals, which could otherwise reduce the power of the transmitted measurement signal.

In a preferred embodiment of the invention, the retroreflector is mounted on a movable robot arm. This allows easy and precise repositioning of the retroreflector.

The invention further relates to a method for measuring the transfer function on a path from a feed antenna via a reflector to a radar sensor testing zone in an anechoic chamber, the method including the following steps:

transmitting a measurement signal in the radar frequency range from the feed antenna via the reflector into the radar sensor testing zone, reflecting, by a retroreflector disposed in the radar sensor testing zone, at least a portion of the measurement signal transmitted into the radar sensor testing zone back to the feed antenna via the reflector.

In accordance with a preferred embodiment of the method of the invention, the portion of the measurement signal that is reflected back and therefore received by the feed antenna and a reflection signal produced when the measurement signal is coupled into the feed antenna are separated by windowing in the time domain. In connection therewith, it is preferred that the method include the following steps:

transforming the frequency range data of the received portion of the measurement signal and the frequency range data of the reflection signal that is produced when the measurement signal is coupled into the feed antenna by an inverse Fourier transform from the frequency domain into the time domain in a time-gating device, selecting a predetermined time interval which, on the one hand, includes the time that is composed of the expected propagation time of the measurement signal on the path from the feed antenna via the reflector to the retroreflector and back and the propagation time of the measurement signal from the feed antenna to the time-gating device, but which, on the other hand, does not include the expected propagation time of the reflection signal from the feed antenna to the time-gating device, so that a windowed time signal is obtained, and transforming the windowed time signal from the time domain back into the frequency domain.

As already explained above, it cannot be ruled out that a reflection may occur when the signal is coupled into the feed antenna. Such reflection would then be superimposed on the measured signal, and the two signals would then be in the same frequency range and, therefore, could not be separated by a filter. Therefore, it is preferred to separate the signals by windowing in the time domain in a time-gating device to distinguish the signals by their different propagation times. The signal that is obtained by transforming the windowed time signal from the time domain back into the frequency domain then contains the information about the transfer function sought.

Further preferred embodiments of a method according to the invention may be derived in analogy to the abovementioned preferred embodiments of a system according to the invention.

The invention will now be more particularly described in connection with an illustrative embodiment and with reference to the accompanying drawings.

In FIG. 1, there is schematically shown a system for testing a radar sensor 5 in the radar sensor testing zone 3 in an anechoic chamber 4. Anechoic chamber 4 has metallic, electrically conductive walls to which are attached absorbers for electromagnetic waves. Furthermore, anechoic chamber 3 is provided with a door. The door allows access to the interior of anechoic chamber 4 and enables anechoic chamber 4 to be closed during the actual testing.

During the testing operation, a radar target simulator 6 simulates, in real time and in response to radar signals received from the radar sensor under test, object reflections, so-called radar targets, which occur in road traffic at different distances and with different speeds and sizes. The reception and transmission of such radar signals is via a feed antenna 1 disposed in anechoic chamber 4, the path between feed antenna 1 and the radar sensor 5 disposed in radar signal testing zone 3 being via a reflector 2.

Since the mechanical prealignment of the components—feed antenna 1, reflector 2, and radar sensor 5—can be accomplished only with finite precision, the complex-valued transfer function from feed antenna 1 via reflector 2 to radar sensor 5 is determined. Via the variation of the amplitude and phase of the transfer function over different locations in radar sensor testing zone 3, it is possible to evaluate the alignment of the components and to determine a required correction. As already explained at the outset, the required corrections may be made, for example, by mechanically aligning feed antenna 1 and reflector 2 relative to each other. The aim of this is to position feed antenna 1 exactly at the focal point of reflector 2. Another option for correction is to vary the position of the radar sensor 5 under test, for example, to tilt it so that it receives a plane wave. Finally, it is also possible to make a correction during the evaluation of the data obtained by the radar sensor 5 under test. This is because radar sensor 5 typically has several transmit and receive antennas, which can be controlled in different ways, thereby making it possible to determine the viewing direction of radar sensor 5. A known misalignment of radar sensor 5 can then be computationally corrected during the evaluation of the data captured by radar sensor 5, for example by applying different delays to the data of the different receive antennas.

Figure 2:
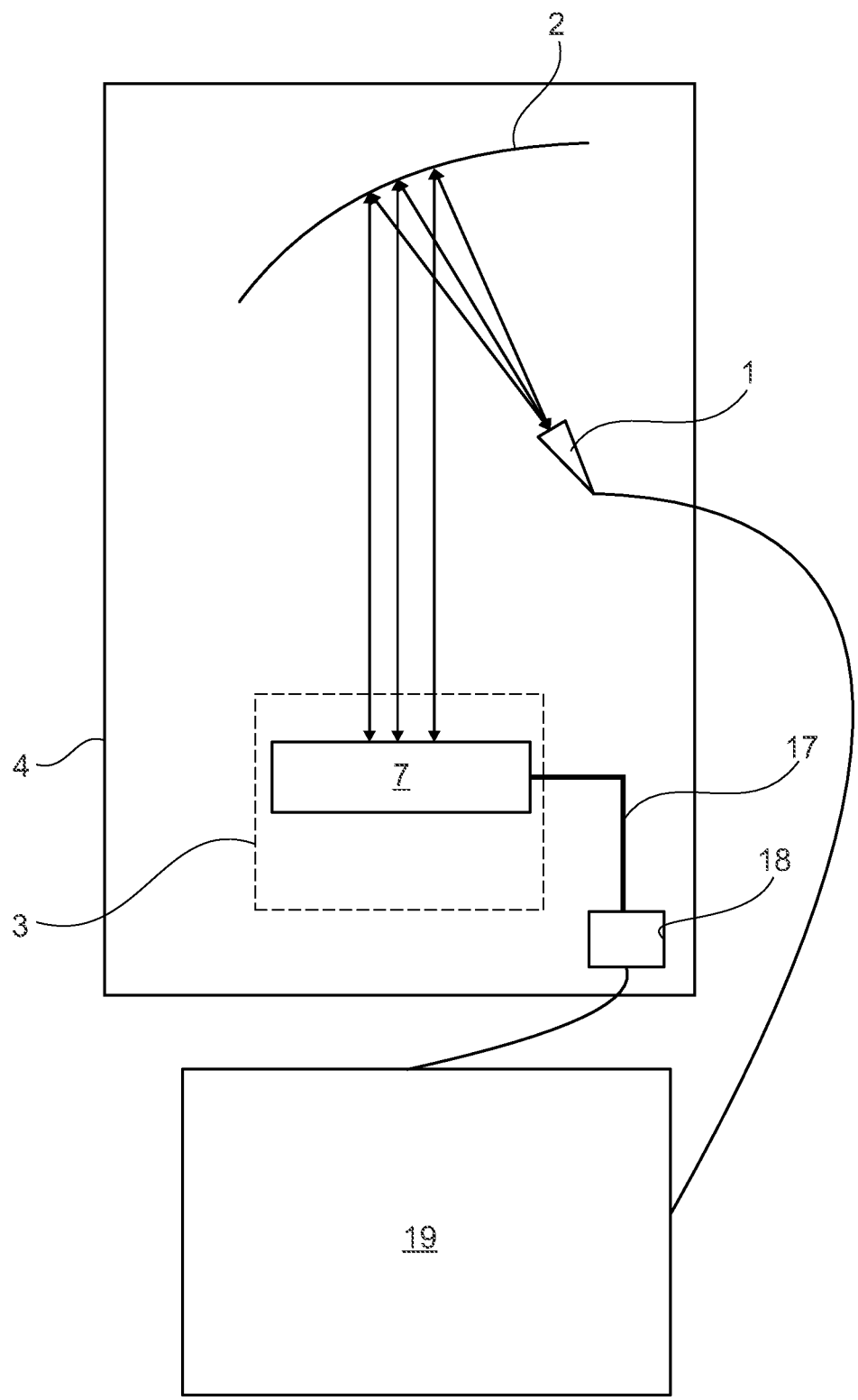
FIG. 2 is a schematic view of a system for measuring the transfer function on a path from a feed antenna via a reflector to a radar sensor testing zone in accordance with a preferred exemplary embodiment of the invention.

Now in order to provide a high-precision measurement of the transfer function on the path from feed antenna 1 via reflector 2 to radar sensor testing zone 3 in anechoic chamber 4, a system such as is schematically shown in FIG. 2 is used. Feed antenna 1, which is configured to transmit and receive a radar signal, is disposed, together with reflector 2, within the anechoic chamber. Instead of a sensor, a retroreflector 7 is now disposed in radar sensor testing zone 3 to cause at least a portion of a measurement signal in the radar frequency range, which measurement signal is received from feed antenna 1 via reflector 2, to be reflected back to feed antenna 1 via reflector 2. Retroreflector 7 is mounted on a robot arm 17, which can be moved by a positioning system 18. The other components 19 of this system are shown, inter alia, in FIG. 3.

Figure 3:
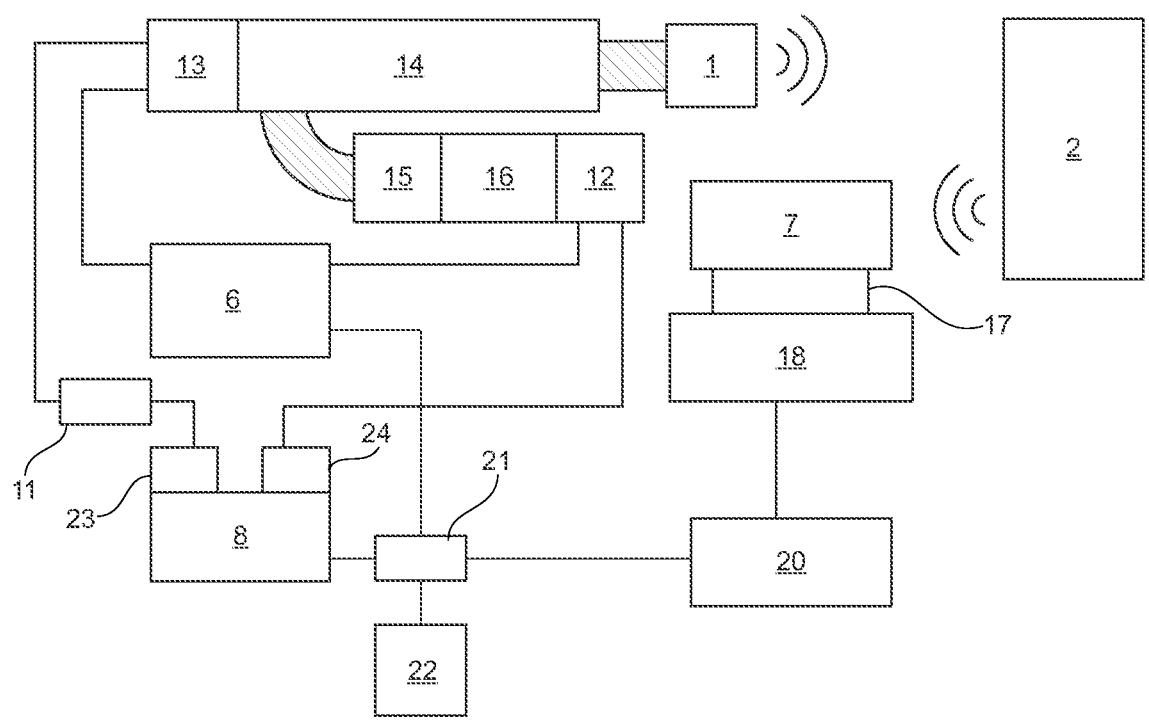
FIG. 3 is a schematic view showing the system of FIG. 2 with further details.
Figure 4:
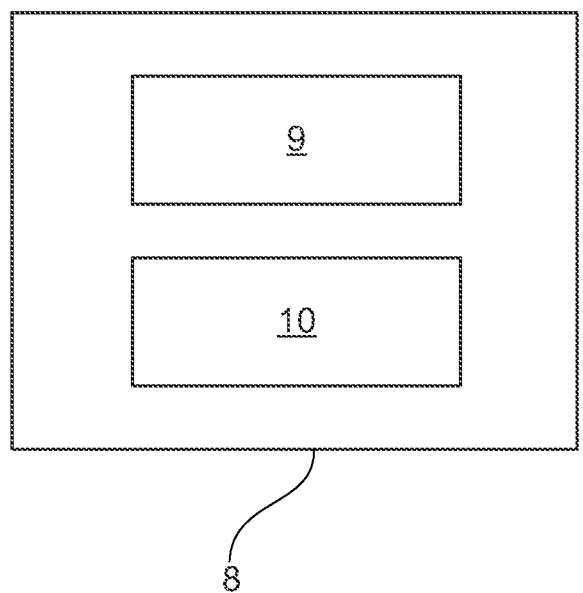
FIG. 4 is a schematic view of a network analyzer according to a preferred exemplary embodiment of the invention.

As shown schematically in FIG. 3, the system has a network analyzer 8 which is connected to feed antenna 1 and adapted to cause the measurement signal to be applied to feed antenna 1 so that it is transmitted by feed antenna 1 and, in addition, to receive a portion of the measurement signal that is reflected back to and received by feed antenna 1, or a measurement signal derived therefrom, so that it can be analyzed in network analyzer 8. As can be inferred in particular from FIG. 4, network analyzer 8 has an evaluation unit 9 configured to determine the transfer function from feed antenna 1 to retroreflector 7. Moreover, network analyzer 8 is provided with a time-gating device 10 configured to allow signals received by network analyzer 8 to be distinguished in terms of their propagation time. The method used for this purpose will be described in detail further below.

Network analyzer 8 further has an input 23 for receiving the measurement signal reflected back and received by feed antenna 1 as well as an output 24 for transmitting the measurement signal to feed antenna 1. An amplifier 11 is connected in series to input 23 to allow detection of even small signals. Furthermore, the system is provided with a transmit frequency converter 12 for applying to feed antenna 1 the measurement signal to be transmitted and a receive frequency converter 13 for receiving the reflected portion of the measurement signal. In connection therewith, the transmit frequency converter 12 and the receive frequency converter 13 of the radar target simulator 6 that are to be employed for the testing of the radar sensor 5 under test are used as the transmit frequency converter 12 and as the receive frequency converter 13. This advantageously eliminates the need to measure the signal in the frequency range up to 81 GHz, which is otherwise common in automotive applications. This would only be possible with very expensive measuring devices. Rather, with the method proposed herein, it is possible to use a network analyzer 8 for frequencies less than 6 GHz. Thus, a mobile measuring device can be used instead of a large laboratory apparatus. The required frequency conversion of the measurement signal to the higher frequency is performed by transmit frequency converter 12, and the conversion of the measurement signal to the lower frequency is performed by receive frequency converter 13.

As to further details about the configuration of the system, a coupler 14 is connected between feed antenna 1, on one side, and transmit frequency converter 12 and receive frequency converter 13 on the other side, the coupler 14 being configured to separate the received radar signal from the transmitted measurement signal. Furthermore, a bandpass filter 15 is connected between transmit frequency converter 12 and coupler 14, the bandpass filter 15 being configured such that feed antenna 1 can only transmit radar signals within a predetermined frequency range. This significantly reduces superimposition of signals which are outside the frequency band on the payload signals on the receive side during down-conversion. Furthermore, an isolator 16 is connected between transmit frequency converter 12 and bandpass filter 15 to attenuate reflected signals coming from the direction of bandpass filter 15 and coupler 14 and not to feed them back to transmit frequency converter 12. This reduces or avoids unwanted resonance phenomena caused by reflected signals, which could otherwise reduce the power of the transmitted measurement signal.

The system described herein is centrally controlled via a PC 22, which is connected by a switch 21 to a positioning controller 20 for the retroreflector 7 mounted on robot arm 17, to radar target simulator 6, and to network analyzer 8. In connection therewith, it should be noted once again that the diagram of FIG. 3 is merely schematic. In particular, while transmit frequency converter 12 and receive frequency converter 13 are shown separately from radar target simulator 6, they actually form part of radar target simulator 6.

Figure 5:
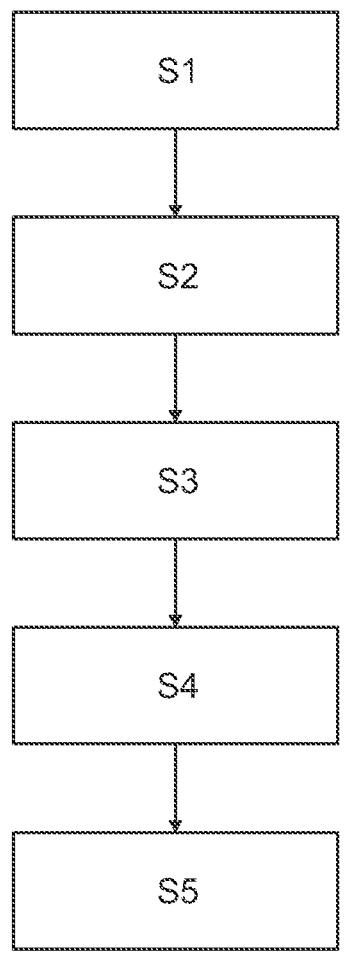
FIG. 5 is a flowchart of a method according to a preferred exemplary embodiment of the invention.

Further, in accordance with a preferred exemplary embodiment of the invention, the sequence shown in FIG. 5 for operating the aforedescribed system is as follows: In a first step S1, a measurement signal in the radar frequency range is transmitted from feed antenna 1 via reflector 2 into radar sensor testing zone 3. Subsequently, in step S2, the retroreflector 7 disposed in radar sensor testing zone 3 causes a portion of the measurement signal that is transmitted into radar sensor testing zone 3 to be reflected back to feed antenna 1 via reflector 2. However, it cannot be ruled out that a reflection may occur when the measurement signal is coupled into feed antenna 1. Such reflection would then, of course, be superimposed on the back-reflected measurement signal. The reflected signal and the back-reflected measurement signal would then be in the same frequency range and, therefore, could not be separated by a filter. In this respect, the method described herein provides that the portion of the measurement signal that is reflected back and therefore received by feed antenna 1 and a reflection signal produced when the measurement signal is coupled into feed antenna 1 be separated by windowing in the time domain.

To this end, in step S3, the frequency range data of the received portion of the measurement signal and the frequency range data of the reflection signal that is produced when the measurement signal is coupled into feed antenna 1 are transformed by an inverse Fourier transform from the frequency domain into the time domain in a time-gating device 10. Subsequently, in step S4, a predetermined time interval is then selected which, on the one hand, includes the time that is composed of the expected propagation time of the measurement signal on the path from feed antenna 1 via reflector 2 to retroreflector 7 and back and the propagation time of the measurement signal from feed antenna 1 to time-gating device 10, but which, on the other hand, does not include the expected propagation time of the reflection signal from feed antenna 1 to time-gating device 10, so that a windowed time signal is obtained. Finally, in step S5, the windowed time signal is transformed from the time domain back into the frequency domain. The signal obtained in this way then contains the information about the transfer function sought, without any noise caused by the reflection. As described earlier above, the transfer function is thus itself used to correct the alignment of the components—feed antenna 1, reflector 2, and radar sensor 5—during the testing operation.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 1 feed antenna
2 reflector
3 radar sensor testing zone
4 anechoic chamber
5 radar sensor
6 radar target simulator
7 retroreflector
8 network analyzer
9 evaluation unit
10 time-gating device
11 amplifier
12 transmit frequency converter
13 receive frequency converter
14 coupler
15 bandpass filter
16 isolator
17 robot arm
18 positioning system
19 other components
20 positioning controller
21 switch
22 PC
23 input of the network analyzer
24 output of the network analyzer

The invention claimed is:

1. A system for measuring the transfer function on a path from a feed antenna via a reflector to a radar sensor testing zone, the system comprising:
   an anechoic chamber;
   the feed antenna, wherein the feed antenna is configured to transmit and receive a radar signal, and wherein the feed antenna is disposed, together with the reflector, within the anechoic chamber;
   the radar sensor testing zone, wherein the radar sensor testing zone is a predetermined area within the anechoic chamber, in which area a radar sensor under test is to be tested with the aid of a radar target simulator via a radar signal transmitted by the feed antenna; and
   a retroreflector disposed in the radar sensor testing zone, wherein the retroreflector is configured to cause at least a portion of a measurement signal in the radar frequency range to be reflected back to the feed antenna via the reflector, wherein the measurement signal is received from the feed antenna via the reflector.

2. The system as recited in claim 1, further comprising:
   a network analyzer which is connected to the feed antenna and configured to cause the measurement signal to be applied to the feed antenna so that it is transmitted by the feed antenna and, in addition, to receive a portion of the measurement signal that is reflected back to and received by the feed antenna.

3. The system as recited in claim 2, further comprising:
   an evaluation unit configured to determine the transfer function from the feed antenna to the retroreflector.

4. The system as recited in claim 3, further comprising:
   a time-gating device configured to allow signals received by the network analyzer to be distinguished in terms of their propagation time.

5. The system as recited in claim 2, wherein the network analyzer is provided with an input for receiving the portion of the measurement signal that is reflected back to and received by the feed antenna, and wherein an amplifier is connected in series to the input.

6. The system as recited in claim 1, further comprising:
   a transmit frequency converter for applying to the feed antenna the measurement signal to be transmitted; and
   a receive frequency converter for receiving the reflected portion of the measurement signal.

7. The system as recited in claim 6, wherein the transmit frequency converter is configured for conversion to a higher frequency, and the receive frequency converter is configured for conversion to a lower frequency.

8. The system as recited in claim 6, wherein the transmit frequency converter and the receive frequency converter, are part of the radar target simulator that is to be used for the testing of the radar sensor under test.

9. The system as recited in claim 6, wherein a coupler is connected between the feed antenna, on one side, and the transmit frequency converter and the receive frequency converter on the other side, wherein the coupler is configured to separate the received measurement signal from the transmitted measurement signal.

10. The system as recited in claim 9, wherein a bandpass filter is connected between the transmit frequency converter and the coupler, the bandpass filter being configured such that the feed antenna can only transmit measurement signals within a predetermined frequency range.

11. The system as recited in claim 10, wherein an isolator is connected between the transmit frequency converter and the bandpass filter to attenuate reflected signals coming from the direction of the bandpass filter and the coupler and to not feed them back to the transmit frequency converter.

12. The system as recited in claim 1, wherein the retroreflector is mounted on a movable robot arm.

13. A method for measuring the transfer function on a path from a feed antenna via a reflector to a radar sensor testing zone in an anechoic chamber, the method comprising:
    transmitting a measurement signal in a radar frequency range from the feed antenna via the reflector into the radar sensor testing zone; and
    reflecting, by a retroreflector disposed in the radar sensor testing zone, at least a portion of the measurement signal transmitted into the radar sensor testing zone back to the feed antenna via the reflector.

14. The method as recited in claim 13, wherein the portion of the measurement signal that is reflected back and received by the feed antenna and a reflection signal produced based on the measurement signal being coupled into the feed antenna are separated by windowing in the time domain.

15. The method as recited in claim 14, further comprising:
    transforming frequency range data of the received portion of the measurement signal and frequency range data of the reflection signal by an inverse Fourier transform from the frequency domain into the time domain in a time-gating device;
    selecting a predetermined time interval which, on the one hand, includes the time that is composed of the expected propagation time of the measurement signal on the path from the feed antenna via the reflector to the retroreflector and back and the propagation time of the measurement signal from the feed antenna to the time-gating device, but which, on the other hand, does not include the expected propagation time of the reflection signal from the feed antenna to the time-gating device, so that a windowed time signal is obtained; and
    transforming the windowed time signal from the time domain back into the frequency domain.

* * * * *